US006903592B2

(12) United States Patent
Faue

(10) Patent No.: US 6,903,592 B2
(45) Date of Patent: Jun. 7, 2005

(54) LIMITED VARIABLE WIDTH INTERNAL CLOCK GENERATION

(75) Inventor: Jon Allan Faue, Colorado Springs, CO (US)

(73) Assignee: ProMOS Technologies Inc., Hsinchu (TW)

( * ) Notice: Subject to any disclaimer, the term of this patent is extended or adjusted under 35 U.S.C. 154(b) by 156 days.

(21) Appl. No.: 10/349,281

(22) Filed: Jan. 22, 2003

(65) Prior Publication Data

US 2004/0140838 A1 Jul. 22, 2004

(51) Int. Cl.[7] .................................................. H03K 3/00
(52) U.S. Cl. ...................................... 327/291; 327/172
(58) Field of Search ................................. 327/291, 299, 327/294, 297, 261, 263, 170, 172–175, 178

(56) References Cited

U.S. PATENT DOCUMENTS

| 5,161,161 A | | 11/1992 | Malek-Khosravi et al. | |
| 5,214,431 A | * | 5/1993 | Oikawa | 341/143 |
| 5,281,874 A | * | 1/1994 | Sorrells et al. | 327/269 |
| 6,043,697 A | * | 3/2000 | Jang | 327/299 |
| 6,222,408 B1 | * | 4/2001 | Saeki | 327/271 |
| 6,339,555 B1 | * | 1/2002 | Hamada et al. | 365/201 |
| 6,370,210 B1 | * | 4/2002 | Yamamoto | 375/345 |
| 6,677,791 B2 | * | 1/2004 | Okuda et al. | 327/158 |

* cited by examiner

*Primary Examiner*—Timothy P. Callahan
*Assistant Examiner*—Cassandra Cox
(74) *Attorney, Agent, or Firm*—Peter J. Meza; William J. Kubida; Hogan & Hartson LLP

(57) ABSTRACT

A circuit and method of generating an internal chip clock signal for distribution throughout an integrated circuit in response to an external clock signal includes the steps of generating a minimum width internal clock signal if the width of the external clock signal is less than a predetermined minimum width, generating an internal clock signal having a width substantially equal to the width of the external clock signal if the width of the external clock signal is greater than a predetermined minimum width but less than a predetermined maximum width, and generating a maximum width internal clock signal if the width of the external clock signal is greater than a predetermined maximum width.

18 Claims, 7 Drawing Sheets

LIMITED VARIABLE WIDTH INTERNAL CLOCK GENERATION

BACKGROUND OF THE INVENTION

The present invention relates, in general, to the field of integrated circuit ("IC" or "chip") devices. More particularly, the present invention relates to a clock generator circuit for supplying a clock signal for distribution throughout the IC, such as a memory IC, and a corresponding method of operation.

There are two existing internal clock generation schemes that are widely known and used in the art.

In a first type of internal clock generation, the internal clock is a buffered version of the external clock. The internal clock high and low times, duty cycle, and frequency are all replications of the external clock signal. There are two main problems with this scheme. First, at very high frequencies the internal clock high time may not be long enough for proper chip operation. In this case not as much clock low time is required and so an internal duty cycle greater than 50% is preferred. Second, at lower frequencies there may be too much clock high time for proper chip operation. At some point enough clock high time has expired to complete all necessary chip functions, with margin, and it would be preferable to start the next function normally associated with the falling edge of the clock.

In a second type of internal clock generation, the internal clock is generated as a fixed-width pulse ("one-shot"), based on the rising edge of the external clock. The width of the internal clock signal is fixed and therefore does not change with frequency. The main problem with this is margin. If the internal clock pulse width is designed to accomplish all necessary chip functions with enough margin, the resultant clock signal is usually too slow for high speed operation. If the internal clock pulse width is designed without sufficient margin, then failures occur no matter how slow the clock frequency is.

The problems cited above as well as other clock signal-based problems are illustrated in the timing diagrams of FIGS. 1–3.

Referring to FIG. 1, the high time of the external clock signal is less than a minimum acceptable time for proper operation of the integrated circuit. The external clock signal is shown as waveform 10A. In a first prior art technique, the internal clock signal is shown as waveform 12A, which is an internally buffered version of the external clock. As discussed above the problem with this technique is that the width of the internal clock signal may be too narrow to complete all necessary chip functions as the external clock signal frequency increases or the duty cycle decreases. In a second prior art technique, the internal clock signal is shown as waveform 14A, in which the width of the clock signal is constant as specified by a one-shot circuit.

Referring to FIG. 2, the high time of the external clock signal is between minimum and maximum acceptable times for proper operation of the integrated circuit. The external clock signal is shown as waveform 10B. In a first prior art technique, the internal clock signal is shown as waveform 12B, which is an internally buffered version of the external clock. In a second prior art technique, the internal clock signal is shown as waveform 14B, in which the width of the clock signal is constant as specified by a one-shot circuit. A problem with this technique is that now the low time of the internal clock signal may not be sufficient for proper chip operation.

Referring to FIG. 3, the high time of the external clock signal is greater than a maximum acceptable time for proper operation of the integrated circuit. The external clock signal is shown as waveform 10C. In a first prior art technique, the internal clock signal is shown as waveform 12A, which is an internally buffered version of the external clock. A problem with this technique is that the falling edge of the internal clock signal with respect to the rising edge of the next external clock signal may be too narrow to complete all necessary chip functions as the external clock signal frequency increases or the duty cycle increases. In a second prior art technique, the internal clock signal is shown as waveform 14C, in which the width of the clock signal is constant as specified by a one-shot circuit.

What is desired is an optimum type of internal clock signal for an integrated circuit such that failures decrease as the part is run at slower frequencies. This correlation results in higher yields as fewer parts are completely thrown away, regardless of how fast or slow they may be.

SUMMARY OF THE INVENTION

Particularly disclosed herein is a circuit and corresponding method that sets a minimum and a maximum on internal clock width generation. There are three operational modes for the internal clock generator circuit of the present invention. In a first operational mode, the external clock width is less than the minimum internal clock width, and so the minimum internal clock width is used inside the chip. In a second operational mode, the external clock width is between the minimum and maximum internal clock widths, and so the external clock width is used inside the chip. In a third operational mode, the external clock width is greater than the maximum internal clock width, and so the maximum internal clock width is used inside the chip.

The minimum clock high time can be set very aggressively, with practically no margin for obtaining the highest speeds required. If a given part is too slow to pass this requirement, then running at a slightly slower speed automatically increases the clock high time thereby resulting in a passing condition. However, after enough clock high time margin has elapsed, such that any reasonable integrated circuit should pass, then the internal clock is driven low (regardless of the state of external clock) and the internal chip functions can progress to the next stage. Performance is increased because the chip is not waiting for the external clock transition to occur.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

In the present invention TCH is defined as the clock high time, and TCL is defined as the clock low time, for both external and internal clock signals.

There are two key delay elements in the circuit of the present invention. The TCH_MIN delay sets the time for which the narrowest internal clock high time is allowed. This is an aggressive time setting that has little or no margin in providing the internal clock high time to achieve all necessary functions. The "DELTA TCH_MAX" delay plus the TCH_MIN delay is equal to the total maximum delay ("TCH_MAX") allowed for the internal clock high time. This is ideally based on providing a very safe margin in the internal clock time. Therefore:

TCH_MAX=TCH_MIN+DELTA TCH_MAX

Figure 4:
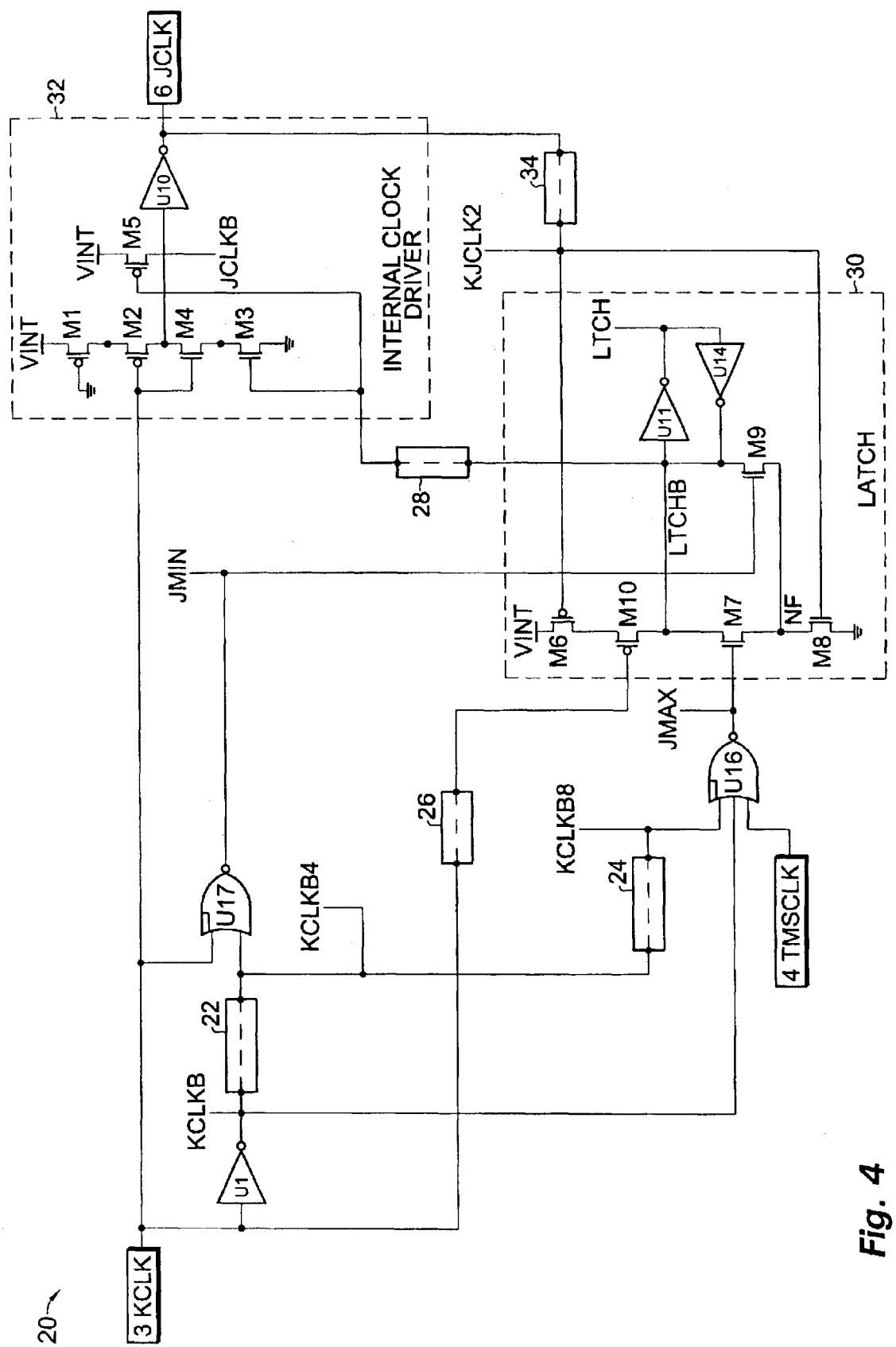
FIG. 4 is a block/schematic diagram of an internal clock generator circuit according to the present invention.

Referring now to FIG. 4, the clock generator circuit 20 of the present invention is initialized with the external clock set low, and the internal clock set low. At this point the internal clock generator is considered "armed", and ready to generate a clock signal.

Upon detecting a rising edge of the external clock, the internal clock also rises. At this point the internal clock becomes latched via latch circuit 30 in the high state and is not directly dependent upon the external clock.

The rising edge of the external clock begins to propagate through the TCH_MIN delay chain 22. If the external clock goes low prior to the rising edge propagating through the TCH_MIN delay chain 22, the internal clock remains high, and goes low when the delay chain is completed.

If the propagation of the external rising edge through the TCH_MIN delay chain 22 completes, and the external edge is still high, control for this element of the design reverts to being directly dependent upon the external clock.

Thus, regardless of the external clock's TCH, the internal clock's TCH is always greater than or equal to TCH_MIN.

Upon completion of the rising edge through the TCH_MIN delay circuit 22 the signal then starts propagating through the DELTA-DELAY circuit 24. When this delay expires, regardless of the state of the external clock, the internal clock is driven low. Thus, the internal TCH is never greater than TCH_MAX.

However, if the external clock goes low after the completion of the TCH_MIN delay, but prior to the completion of the TCH_MAX delay, then the internal TCH equals the external TCH.

The entire circuit resets for the next cycle when the external clock and the internal clock are in the low state.

The small delay circuits 26, 28, and 34 are ideally included for proper timing within the internal clock generator circuit 20 and are implemented with inverters and logic gates as described in further detail below. A clock driver circuit 32 is also included for driving the internal clock signal throughout the chip as required. The width of transistor M1 is made small so transistor M5 controls when JCLK B=1. Both the latch circuit 30 and the internal clock driver circuit 32 include an input section and a cross-coupled output latch or a buffer section. The delay circuits include integrated circuit capacitors, and the rest of the circuitry is fabricated using CMOS circuitry. A more detailed schematic diagram implementation is further explained below.

A simplified table of operation is given below wherein TCH (clock high time), TCH_MIN, and TCH_MAX are all determined by design constraints as required.

SIMPLIFIED TABLE OF OPERATION

| External TCH | Internal TCH |
|---|---|
| <TCH_MIN | TCH_MIN |
| >TCH_MIN or <TCH_MAX | External TCH |
| >TCH_MAX | TCH_MAX |

Figure 1:
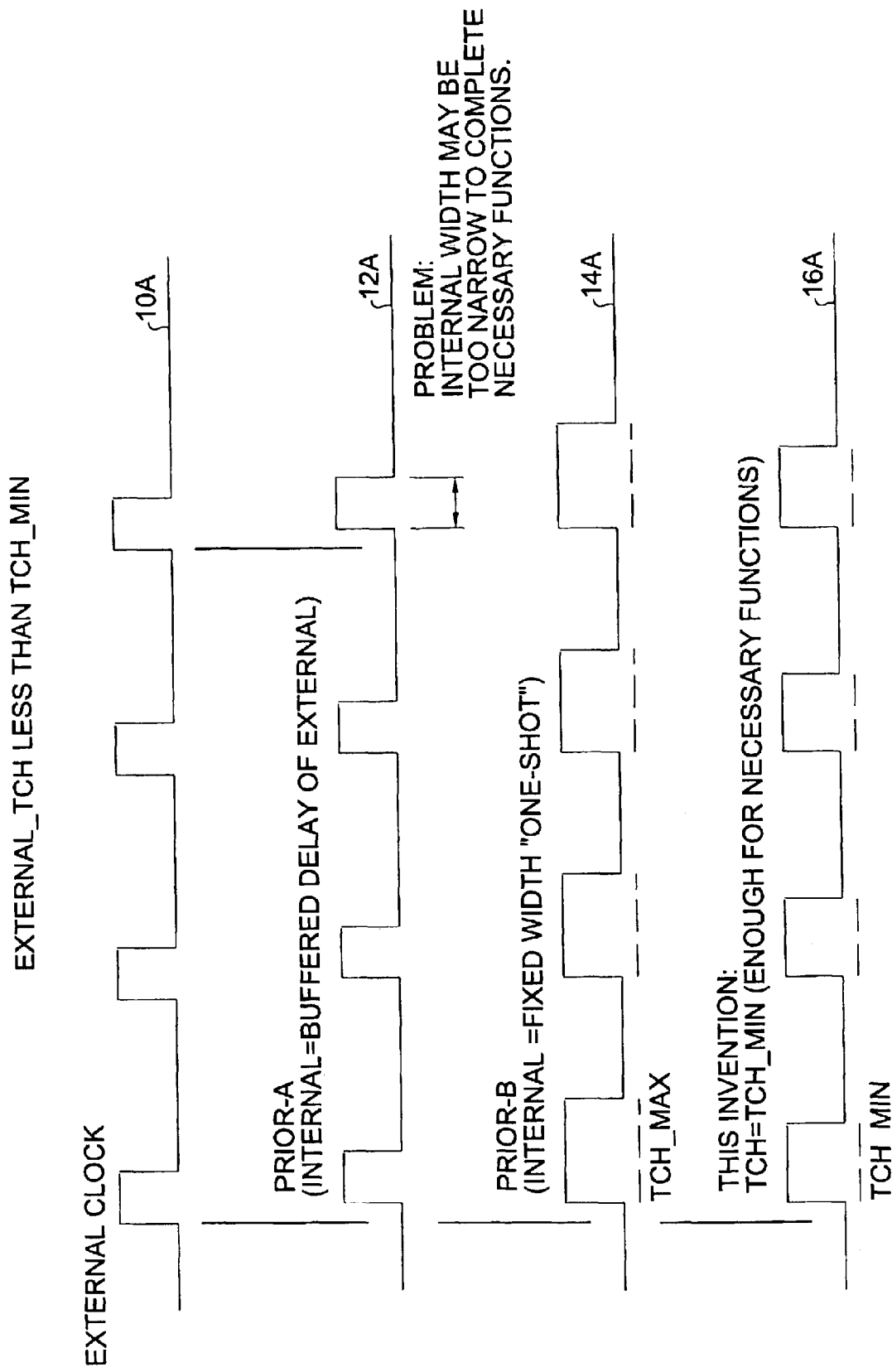
FIG. 1 is a series of clock timing diagrams associated with a first operational mode of the internal clock generator according to the present invention.
Figure 2:
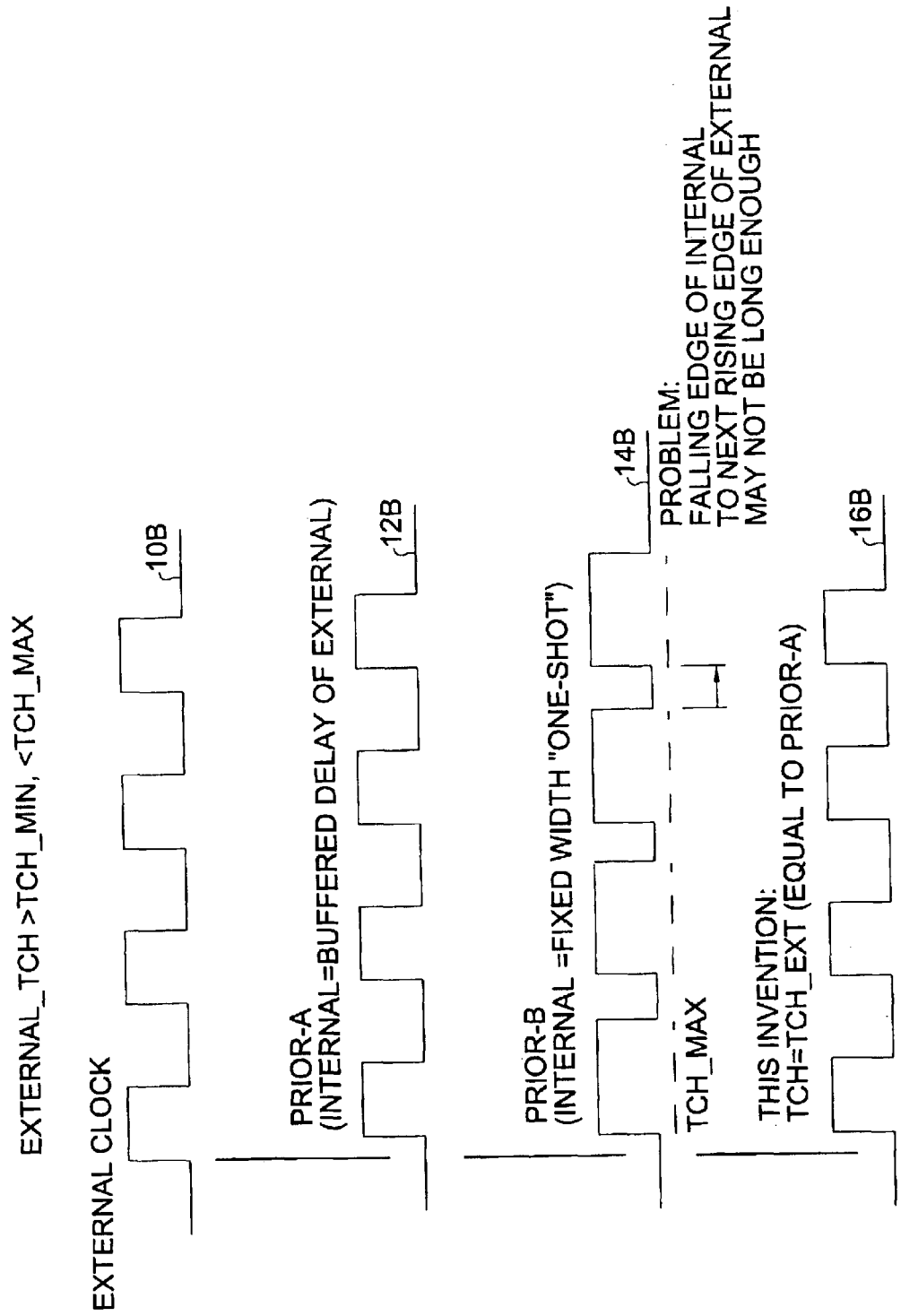
FIG. 2 is a series of clock timing diagrams associated with a first operational mode of the internal clock generator according to the present invention.
Figure 3:
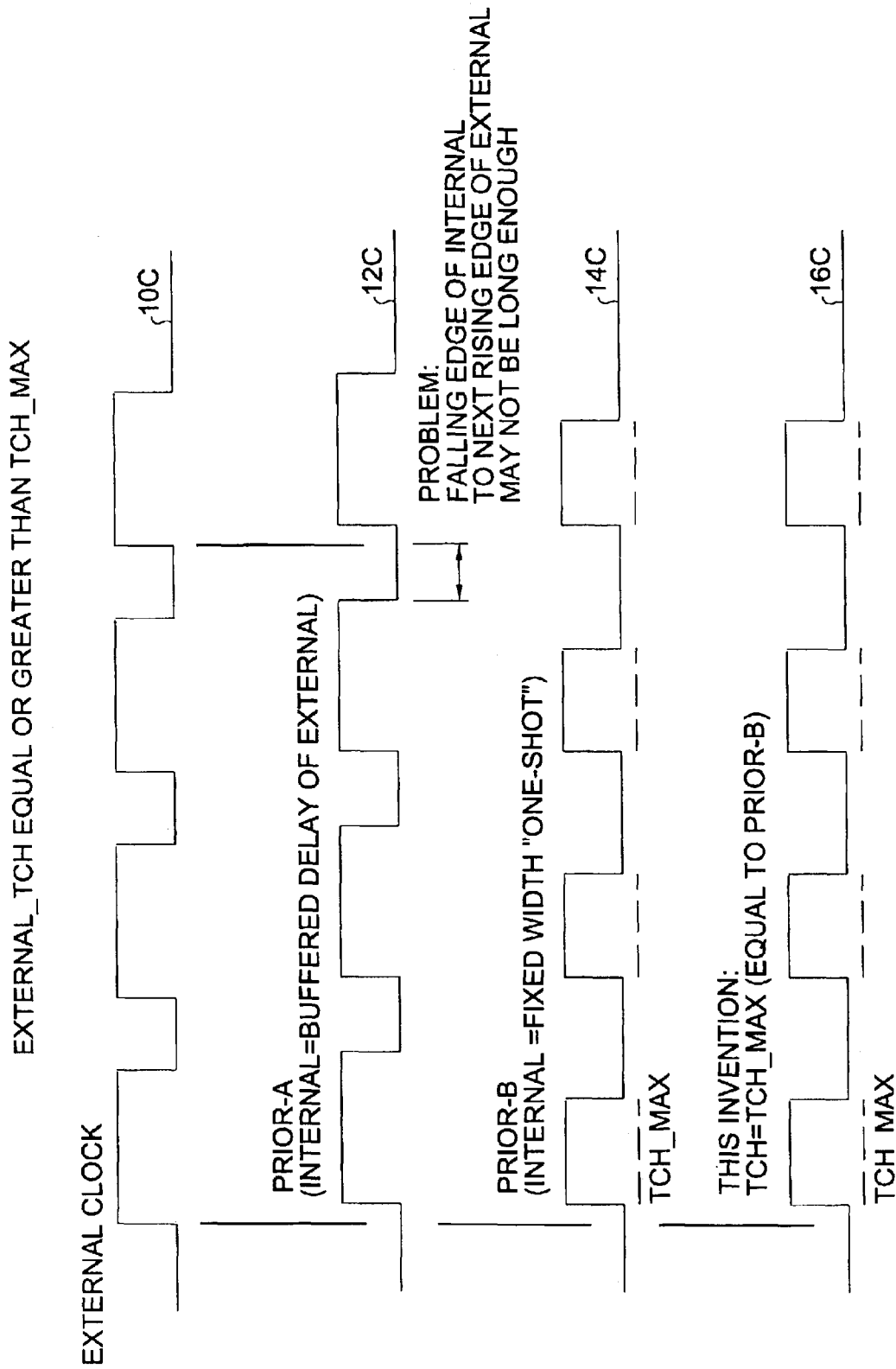
FIG. 3 is a series of clock timing diagrams associated with a first operational mode of the internal clock generator according to the present invention.

Referring back to FIGS. 1–3, the optimum internal clock signal waveforms 16A, 16B, and 16C, respectively, can be seen for each of the three operational modes set forth in the table of operation.

Figures 5, 5A:
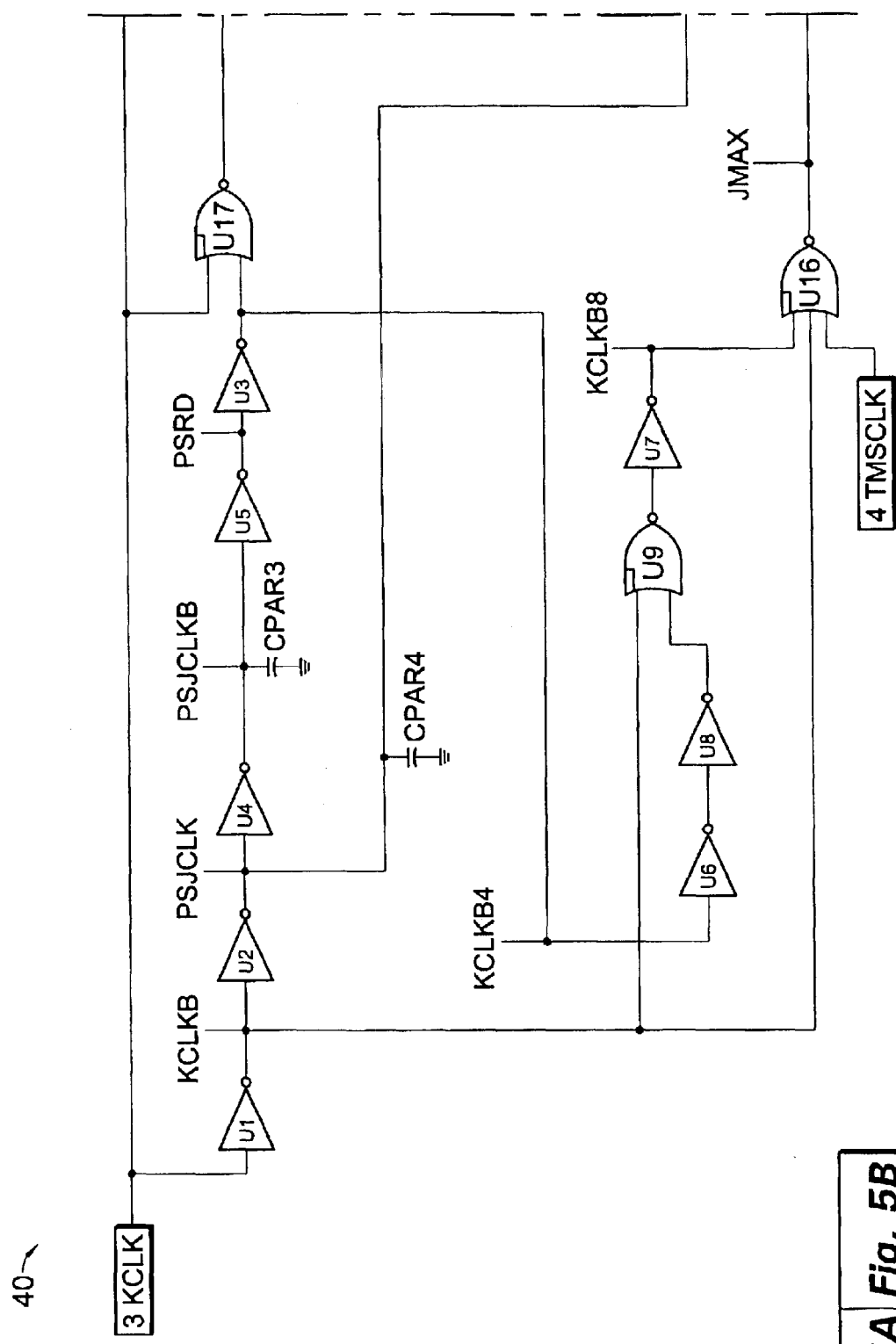
FIGS. 5, 5A, and 5B form is a more detailed schematic diagram of an internal clock generator circuit according to the present invention.
Figure 5B:
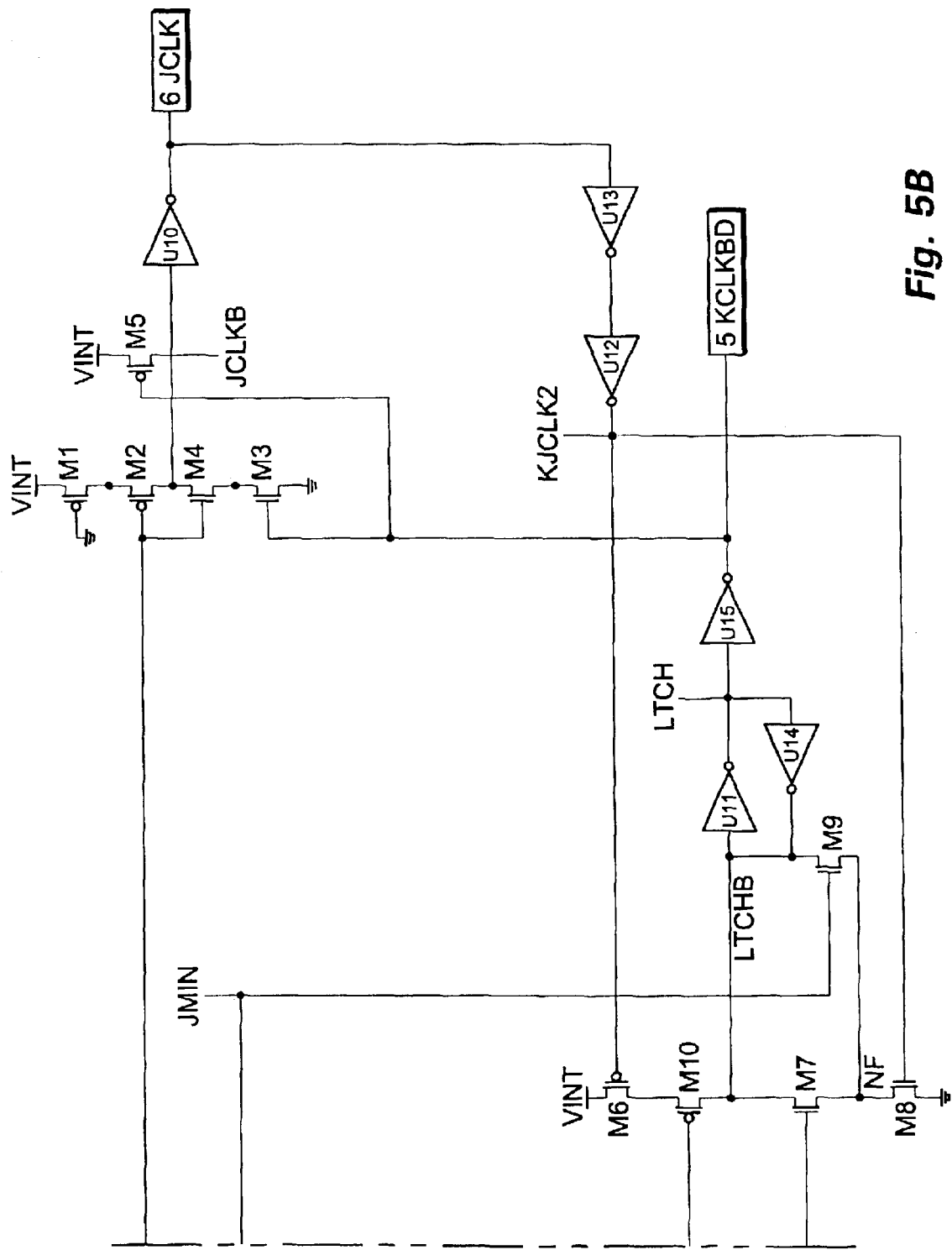

A more detailed description of the operation of the internal clock generator of the present is made with reference now to the detailed circuit diagram formed by FIGS. 5, 5A and 5B. The operation of internal clock generator circuit 40 proceeds for the three different operational modes set forth below:

a) External TCH<TCH_MIN;
b) External TCH>TCH_MIN, <TCH_MAX; and
c) External TCH>TCH_MAX.

The circuit nodes of interest are defined and set forth below.

KCLK=External buffered clock
KCLKB=KCLK inverted (1 gate delay)
KCLKB4=KCLKB+TCH_MIN delay
KCLKB8=KCLKB4+DELTA-DELAY
JMIN=KCLK NOR KCLKB4
JMAX=KCLKB8 NOR KCLKB
LTCHB=latched node to keep width of internal clock (JCLK) from varying outside allowed limits.
KCLKBD=LTCHB+two gates (delay and redrive)
KJCLK2=JCLK+two gates (delay and redrive)
PSJCLK=KCLKB+one gate (delay and redrive)
JCLKB=JCLK−one inverter The circuit nodes of interest are located on the circuit schematics of FIGS. 5, 5A and 5B as set forth below.

KCLK is the external clock input node coupled to the input of inverter U1, one of the inputs of NOR gate U17, the gate of P-channel transistor M2 and the gate of N-channel transistor M4.

KCLKB is the output of inverter U1, the input of inverter U2, one of the inputs of NOR gate U9, and one of the inputs of inverter U16.

KCLKB4 is the output of inverter U3, the other input to gate U17, and the input to inverter U6.

KCLKB8 is the output of inverter U7 and one of the inputs to logic gate U16.

JMIN is the output of gate U17 and the input to N-channel transistor M9.

JMAX is the output of gate U16 and the input to N-channel transistor M7.

LTCHB is the junction of P-channel transistor M10, N-channel transistors M7 and M9, and the cross-coupled latch consisting of inverters U11 and U14.

KCLKBD is the output of inverter U15, as well as the inputs to N-channel transistor M3 and P-channel transistor M5.

KJCLK2 output of inverter U12, and the inputs P-channel transistor M6 and N-channel transistor M8.

PSJCLKB is the output of inverter U4, the input of inverter U5, and an electrode of integrated circuit capacitor CPAR3 (delay falling edge).

JCLKB is the junction of P-channel transistors M2 and M5, and N-channel transistor M4, as well as the input to inverter U10.

TMSCLK is the test mode input and one of the inputs of inverter U16 and is nominally zero volts.

The initial conditions for all three operational modes assumes that the external clock signal KCLK is set to zero for a long time in order to initialize circuit 40. The rest of the initial conditions are set forth below.

KCLK=0
JCLK=0 (always=0 if KCLK has been=0 long enough, through M1/M2 path)
KCLKB=1
KCLKB4=1
KCLKB8=1
JMIN=0 (KCLKB4=1)
JMAX=0 (KCLKB=1)
LTCHB=1 (essentially because KCLK and JCLK=0, directly because PSJCLK=0 and KJCLK2=0).

The description of the first, second, and third operational modes proceeds with the node labels encompassing both the node label as well as the voltage or waveform on that node.

In the first operational mode, the external TCH is less than TCH_MIN. First, the external clock KCLK rises from 0 to 1. Then JCLK rises from 0 to 1 (since JCLKB=LTCHB/KCLKBD NAND KCLK). Then KCLKB falls from 1 to 0. KCLKB4 still equals 1 because KCLKB is propagating through the TCH_MIN delay chain. Since KCLKB4=1, JMIN is still=0. KCLKB8 still equals 1 since KCLKB4=1, and JMAX=0. Even though JCLK/KJCLK2=1, LTCHB stays unchanged (latched) since JMIN and JMAX=0.

Next, the external clock falls and the internal clock stays high, KCLK=0 JCLK=1, since LTCHB is still high, and the M1M2 path is too slow to change JCLKB quickly. KCLKB=1, but the KCLKB=0 transition still propagates through the TCH_MIN delay. KCLKB4 is still=1, so JMIN=0 and KCLKB8 is still=1, so JMAX=0.

Then, the propagation of the initial KCLKB=0 transition reaches the end, so KCLKB4=0. Since KCLK=0 and KCLKB4=0, JMIN=1. With JMIN=1 and JCLK/KJCLK2=1, LTCHB/KCLKBD=0, JCLKB=1 and JCLK=0. (JMAX remains=0 for the entire time.)

At this point the entire circuit 40 is reset back to the original condition with KCLK=JCLK=0. Even though the external clock had too narrow of a TCH value, the internal clock's TCH value was held high long enough by the TCH_MIN delay time.

In the second operational mode, the external TCH is greater than TCH_MIN but less than TCH_MAX. First, the external clock KCLK rises from 0 to 1 and JCLK rises from 0 to 1 (since JCLKB=LTCHB/KCLKBD NAND KCLK). KCLKB than falls from 1 to 0. KCLKB4 still=1 because KCLKB is propagating through the THC_MIN delay chain. Since KCLKB4=1, JMIN still=0. KCLKB8 still=1 since KCLKB4=1, and JMAX=0. Even though JCLK/KJCLK2=1, LTCHB stays unchanged (latched) since JMIN and JMAX=0.

Next, propagation of the initial KCLKB=0 transition reaches the end so KCLKB4=0. Since KCLK=1, JMIN still=0. The transition of KCLKB4=0 starts through the "DELTA-DELAY" element 24, but KCLKB8 remains 1 and JMAX=0. Since JMIN and JMAX=0, JCLK remains=1.

Next, the external clock falls (KCLK=0). Now JMIN=1 since KCLK=0 and KCLKB4=0 (NOR function). With JMIN=1 and JCLK/KJCLK2=1, LTCHB/KCLKBD=0, JCLKB=1 and JCLK=0 (JMAX remained=0 the entire time).

At this point the entire circuit 40 is reset back to the original condition with KCLK=JCLK=0. Even though the TCH_MIN delay expired, the internal clock did not fall until the external clock did. This adds margin to the internal TCH case where the external clock is slow enough to support it.

In the third operational mode, the external TCH is greater than TCH_MAX. First, the external clock rises. KCLK rises from 0 to 1 and JCLK rises from 0 to 1 (since JCLKB=LTCHB/KCLKBD NAND KCLK). KCLKB falls from 1 to 0. KCLKB4 still=1 because KCLKB is propagating through the THC_MIN delay chain. Since KCLKB4=1, JMIN is still=0. KCLKB8 still=1 since KCLKB4=1, and JMAX=0. Even though JCLK/KJCLK2=1, LTCHB stays unchanged (latched) since JMIN and JMAX=0.

Next, the propagation of the initial KCLKB=0 transition reaches an end so KCLKB4=0. Since KCLK=1, JMIN is still=0. The transition of KCLKB4=0 starts through the "DELTA-DELAY" element 24, but KCLKB8 remains=1 and JMAX=0. Since JMIN and JMAX=0, JCLK remains=1.

Next, the propagation of the KCLKB4=0 transition reaches the end of the "DELTA-DELAY" so KCLKB8=0. Now JMAX=1 since KCLKB=0 and KCLKB8=0 (NOR function). With JMAX=1 and JCLK/KJCLK2=1, LTCHB/KCLKBD=0, JCLKB=1 and JCLK=0. (JMIN remained=0 the entire time.) Had KCLK transitioned=0 just when the KCLKB8=0 transition happened, the circuit would revert to the previous case where JMIN determined when JCLK transitioned.

At this point the entire circuit 40 is reset back to the original condition with KCLK=JCLK=0. Even though the external clock remained high, the TCH_MIN delay plus the "DELTA-DELAY" had both expired so the internal clock was allowed to transition low limiting the maximum value of the internal clock's TCH. The maximum allowable delay is set by the equation: TCH_MAX=TCH_MIN+DELTA-DELAY as discussed above.

Figure 6:
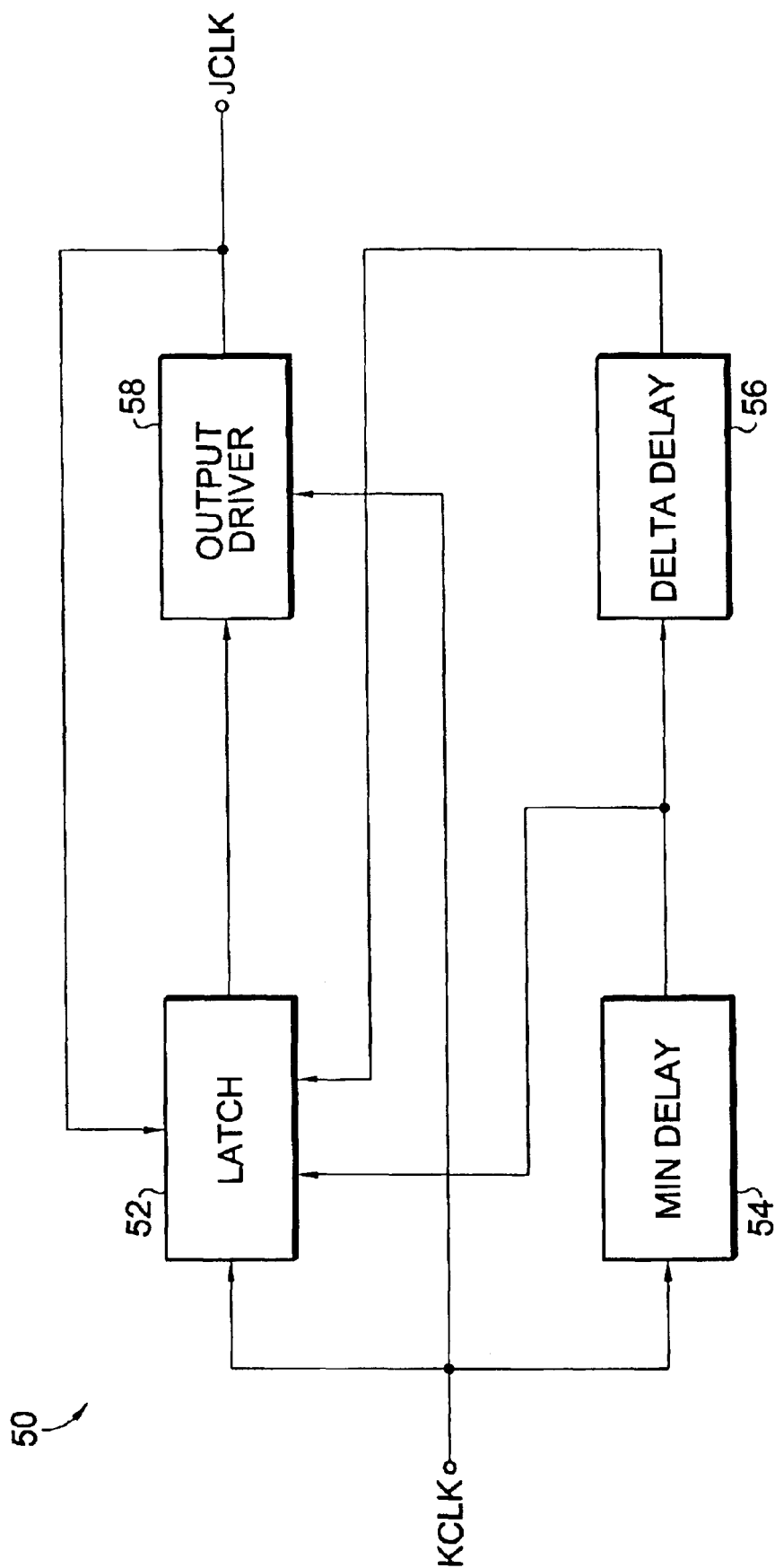
FIG. 6 is a highly simplified block diagram consistent with the schematic diagrams of FIGS. 4 and 5.

Referring now to FIG. 6, a highly simplified block diagram of the internal clock generator circuit 50 of the present invention is shown. Some of the digital circuitry shown in the previous figures has been omitted to maintain simplicity. In circuit 50, a minimum delay circuit 54 has an input for receiving an external clock signal and an output, a delta delay circuit 56 has an input coupled to the output of the minimum delay circuit 54 and an output, a latch circuit 52 has inputs for receiving the external clock signal KCLK as well as the internal clock signal JCLK, an input coupled to the output minimum delay circuit 54, an input coupled to the output of the delta delay circuit 56, and an output, and an output driver circuit 58 has an input for receiving the external clock signal, an input coupled to the output of the latch circuit 52, and an output for generating an internal clock signal JCLK. As discussed above, the delay associated with the minimum delay circuit 54 plus the delay associated with the delta delay circuit 56 is equal to a predetermined maximum delay.

It is important to note that when referring to the "width" of a clock signal, the width can be changed by altering the frequency as well as the duty cycle of the clock signal. That is, the "width" of a clock cycle can be changed by altering the duty cycle while keeping the clock signal frequency constant. In addition, the width of a clock signal can be used to describe both the "high time" of the clock signal TCH, as well as the "low time" of the clock signal TCL. The present invention can therefore be used for external clock signals in which the duty cycle is changed and the frequency remains constant, as well as for external clocks in which the duty cycle remains fixed but the frequency changes.

While there have been described above the principles of the present invention in conjunction with a specific circuit and timing implementation it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An internal clock generator circuit comprising:
   a minimum delay circuit having an input for receiving an external clock signal and an output;
   a delta delay circuit having an input coupled to the output of the minimum delay circuit and an output;
   a latch circuit having an input for receiving the external clock signal, an input coupled to the output minimum delay circuit, an input coupled to the output of the delta delay circuit, and an output; and
   an output driver circuit having an input for receiving the external clock signal, an input coupled to the output of the latch circuit, and an output for generating an internal clock signal.

2. The internal clock generator circuit of claim 1 wherein the minimum delay circuit comprises an integrated circuit capacitor.

3. The internal clock generator circuit of claim 1 wherein the delta delay circuit comprises an integrated circuit capacitor.

4. The internal clock generator circuit of claim 1 wherein the latch circuit comprises an input section and a cross-coupled latch output section.

5. The internal clock generator circuit of claim 1 wherein the latch circuit comprises CMOS circuitry.

6. The internal clock generator circuit of claim 1 wherein the output driver circuit comprises an input section and a buffer output section.

7. The internal clock generator circuit of claim 1 wherein the output driver comprises CMOS circuitry.

8. The internal clock generator circuit of claim 1 wherein the delay associated with the minimum delay circuit plus the delay associated with the delta delay circuit comprises a predetermined maximum delay.

9. An internal clock generator circuit comprising:
   a first delay circuit;
   a second delay circuit coupled to the first delay circuit;
   a latch circuit having an input for receiving the external clock signal, an input coupled to the first delay circuit, an input coupled to the second delay circuit, and an output for generating an internal clock signal; and
   an output driver circuit having an input for receiving the external clock signal, an input coupled to the output of the latch circuit, and an output for generating a buffered internal clock signal.

10. The internal clock generator circuit of claim 9 wherein the first delay circuit comprises a minimum delay circuit.

11. The internal clock generator circuit of claim 9 wherein the second delay circuit comprises a delta delay circuit.

12. The internal clock generator circuit of claim 9 wherein the delay of the first and second delay circuits comprises a predetermined maximum delay.

13. A method of generating an internal chip clock signal in response to an external clock signal comprising:
   generating a minimum width internal clock signal if the width of the external dock signal is less than a predetermined minimum width;
   generating an internal clock signal having a width substantially equal to the width of the external clock signal if the width of the external clock signal is greater than a predetermined minimum width but less than a predetermined maximum width; and
   generating a minimum width internal clock signal if the width of the external clock signal is greater than a predetermined maximum width.

14. The method of claim 13 further comprising the step of distributing the internal clock signal throughout an integrated circuit.

15. An internal clock generator circuit comprising:
   a first delay circuit;
   a second delay circuit coupled to the first delay circuit;
   a latch circuit having an input for receiving the external clock signal, an input coupled to the first delay circuit, an input coupled to the second delay circuit, and an output for generating an internal clock signal,
   wherein the delay of the first and second delay circuits comprises a predetermined maximum delay.

16. The internal clock generator circuit of claim 15 further comprising an output driver circuit having an input for receiving the external clock signal, an input coupled to the output of the latch circuit, and an output for generating a buffered internal clock signal.

17. The internal clock generator circuit of claim 15 wherein the first delay circuit comprises a minimum delay circuit.

18. The internal clock generator circuit of claim 15 wherein the second delay circuit comprises a delta delay circuit.

* * * * *